US012632186B2

(12) United States Patent
Kim et al.

(10) Patent No.: US 12,632,186 B2
(45) Date of Patent: May 19, 2026

(54) STORAGE DEVICE DETERMINING WHETHER DATA IS ALL ONE OR ALL ZERO BASED ON STATE VALUE AND OPERATING METHOD OF THE STORAGE DEVICE

(71) Applicant: SK hynix Inc., Icheon (KR)

(72) Inventors: Young Gyun Kim, Icheon (KR); Hyeon Uk Lee, Icheon (KR); Dong Jae Shin, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 18/478,429

(22) Filed: Sep. 29, 2023

(65) Prior Publication Data

US 2024/0393965 A1    Nov. 28, 2024

(30) Foreign Application Priority Data

May 24, 2023    (KR) ........................ 10-2023-0066657

(51) Int. Cl.
*G06F 3/06* (2006.01)
*G11C 16/26* (2006.01)
*G11C 16/10* (2006.01)

(52) U.S. Cl.
CPC .......... *G06F 3/0625* (2013.01); *G06F 3/0659* (2013.01); *G06F 3/0673* (2013.01); *G11C 16/26* (2013.01); *G11C 16/10* (2013.01)

(58) Field of Classification Search
CPC .... G06F 3/0625; G06F 3/0659; G06F 3/0673; G11C 16/26; G11C 16/10
See application file for complete search history.

(56) References Cited

U.S. PATENT DOCUMENTS

| | | | |
|---|---|---|---|
| 10,509,570 B2 | 12/2019 | Rostock | |
| 2003/0214844 A1* | 11/2003 | Iijima | G11C 16/26 |
| | | | 365/185.21 |
| 2016/0224241 A1* | 8/2016 | Verrilli | G06F 11/1048 |
| 2018/0261290 A1* | 9/2018 | Uehara | G11C 16/3459 |
| 2020/0042210 A1* | 2/2020 | Schardt | G06F 3/0644 |
| 2020/0081635 A1* | 3/2020 | Huang | G06F 3/0622 |
| 2024/0004581 A1* | 1/2024 | Lu | G06F 3/0659 |

FOREIGN PATENT DOCUMENTS

KR        1020210076729 A        6/2021

OTHER PUBLICATIONS

Microsoft Press; Microsoft Computer Dictionary 5th Edition; p. 440. (Year: 2002).*

* cited by examiner

*Primary Examiner* — Eric T Loonan

(57) ABSTRACT

A storage device may include a memory and a controller. The memory may include a plurality of memory units. The controller may transmit a read command for a target memory unit among the plurality of memory units to the memory, read a state value from the memory after transmitting the read command to the memory, and determine that all bits of data stored in the target memory unit are 1 when the state value is a first value, and determine that all bits of the data stored in the target memory unit are 0 when the state value is a second value.

11 Claims, 9 Drawing Sheets

STORAGE DEVICE DETERMINING WHETHER DATA IS ALL ONE OR ALL ZERO BASED ON STATE VALUE AND OPERATING METHOD OF THE STORAGE DEVICE

CROSS-REFERENCES TO RELATED APPLICATION

The present application claims priority under 35 U.S.C. 119(a) to Korean patent application number 10-2023-0066657 filed in the Korean Intellectual Property Office on May 24, 2023, which is incorporated herein by reference in its entirety.

BACKGROUND

1. Technical Field

Various embodiments generally relate to a storage device determining whether data is all 1 or all 0 based on a state value, and operating method thereof.

2. Related Art

A storage device is a device which stores data on the basis of a request of an external device such as a computer, a mobile terminal such as a smartphone and a tablet, or various electronic devices.

The storage device may include a controller for controlling a memory (e.g., a volatile memory or a nonvolatile memory). The controller may receive a command from the external device, and may execute or control an operation for reading, writing or erasing data with respect to the memory included in the storage device, on the basis of the received command.

The controller may transmit a read command to the memory to read data stored in the memory, and wait until the memory becomes ready. When the memory becomes ready, the controller may receive data output from the memory and decode the received data.

SUMMARY

Embodiments of the disclosure may provide a storage device capable of determining whether all bits of data to be read are 1 or are 0 more quickly, and operating method of the storage device. Embodiments may also reduce power consumption by not transmitting the bits of data to be read when all the bits are 1 or are 0.

In one aspect, embodiments of the disclosure may provide a storage device including i) a memory including a plurality of memory units, and ii) a controller configured to transmit a read command for a target memory unit among the plurality of memory units to the memory, read a state value from the memory after transmitting the read command to the memory, determine that all bits of data stored in the target memory unit are 1 when the state value is a first value, and determine that all bits of the data stored in the target memory unit are 0 when the state value is a second value.

In another aspect, embodiments of the disclosure may provide an operating method of a storage device including i) transmitting to a memory a read command for a target memory unit among a plurality of memory units included in the memory, ii) reading a state value from the memory after transmitting the read command, and iii) determining values of data stored in the target memory unit based on the state value. In this case, the determining the values of the data stored in the target memory unit may include determining that respective values of all bits of the data stored in the target memory unit are 1 when the state value is a first value, and determining that respective values of all bits of the data stored in the target memory unit are 0 when the state value is a second value.

In another aspect, embodiments of the disclosure may provide a memory device including a plurality of memory units, wherein the memory device is configured to receive from a controller a read command for a target memory unit among the plurality of memory units, in response to the read command, determine whether all bits of data stored in the target memory unit are 1 or are 0, determine a state value by setting the state value to a first value in response to determining that all bits of the data stored in the target memory unit are 1, and setting the state value to a second value in response to determining that all bits of the data stored in the target memory unit are 0, and transmit the state value to the controller.

In another aspect, embodiments of the disclosure may provide a controller circuit including an interface configured to communicate with a memory device, the memory device including a plurality of memory units, wherein the controller is configured to transmit to the memory device a read command for a target memory unit among the plurality of memory units, read a state value from the memory after transmitting the read command, determine that all bits of data stored in the target memory unit are 1 when the state value is a first value, and determine that all bits of data stored in the target memory unit are 0 when the state value is a second value.

According to embodiments of the present disclosure, it is possible to determine whether all bits of data to be read are 1 or 0 more quickly.

DETAIL DESCRIPTION OF THE EXEMPLARY EMBODIMENTS

Figure 1:
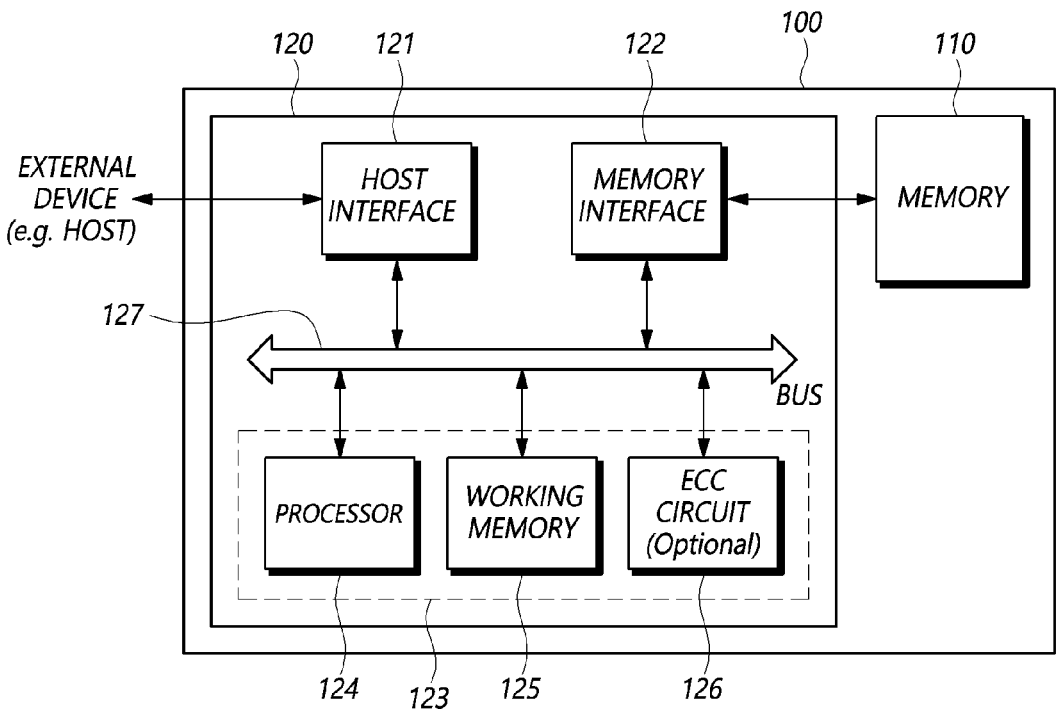
FIG. 1 is a schematic configuration diagram of a storage device according to an embodiment of the disclosure.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily limited to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a schematic configuration diagram of a storage device according to an embodiment of the disclosure.

Referring to FIG. 1, a storage device 100 may include a memory 110 that stores data and a controller 120 that controls the memory 110.

The memory 110 includes a plurality of memory blocks, and operates in response to the control of the controller 120. Operations of the memory 110 may include, for example, a read operation, a program operation (also referred to as a write operation) and an erase operation.

The memory 110 may include a memory cell array including a plurality of memory cells (also simply referred to as "cells") that store data. Such a memory cell array may exist in a memory block.

For example, the memory 110 may be realized in various types of memory such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and a spin transfer torque random access memory (STT-RAM).

The memory 110 may be implemented as a three-dimensional array structure. For example, embodiments of the disclosure may be applied to a charge trap flash (CTF) in which a charge storage layer is configured by a dielectric layer or to a flash memory in which a charge storage layer is configured by a conductive floating gate.

The memory 110 may receive a command and an address from the controller 120 and may access an area in the memory cell array that is selected by the address. In other words, the memory 110 may perform an operation indicated by the command, on the area selected by the address.

The memory 110 may perform a program operation, a read operation, or an erase operation. For example, when performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (program), read, erase, and background operations for the memory 110. For example, background operations may include at least one from among a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. The controller 120, however, also may control the operation of the memory 110 regardless or in the absence of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, and a mobility device (e.g., a vehicle, a robot or a drone) capable of driving under human control or autonomous driving, as non-limiting examples. Alternatively, the host may be a virtual reality (VR) device providing 2D or 3D virtual reality images or an augmented reality (AR) device providing augmented reality images. The host may be any one of various electronic devices that require the storage device 100 capable of storing data.

The host may include at least one operating system (OS). The operating system may generally manage and control the function and operation of the host, and may control interoperability between the host and the storage device 100. The operating system may be classified as a general operating system or as a mobile operating system depending on the mobility of the host.

The controller 120 and the host may be devices that are separated from each other, or the controller 120 and the host may be integrated into one device. Hereunder, for the sake of convenience in explanation, descriptions will describe the controller 120 and the host as devices that are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface that uses at least one from among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an IDE (integrated drive electronics) protocol, and a private protocol.

When receiving a command from the host, the control circuit 123 may receive the command through the host interface 121, and may perform an operation of processing the received command.

The memory interface 122 may be coupled with the memory 110 to provide an interface for communication with the memory 110. That is to say, the memory interface 122 may be configured to provide an interface between the memory 110 and the controller 120 in response to the control of the control circuit 123.

The control circuit 123 performs the general control operations of the controller 120 to control the operation of the memory 110. To this end, for instance, the control circuit 123 may include at least one of a processor 124 and a working memory 125, and may optionally include an error detection and correction circuit (ECC circuit) 126.

The processor 124 may control general operations of the controller 120, and may perform a logic calculation. The processor 124 may communicate with the host through the host interface 121, and may communicate with the memory 110 through the memory interface 122.

The processor 124 may execute logical operations required to perform the functions of a flash translation layer (FTL). The processor 124 may translate a logical block address (LBA), provided by the host, into a physical block address (PBA) through the flash translation layer. The flash translation layer may receive the logical block address and translate the logical block address into the physical block address by using a mapping table.

There are various address mapping methods of the flash translation layer, depending on a mapping unit. Representative address mapping methods include a page mapping method, a block mapping method and a hybrid mapping method.

The processor 124 may randomize data received from the host. For example, the processor 124 may randomize data received from the host by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110 by using a derandomizing seed. The derandomized data may be outputted to the host.

The processor 124 may execute firmware to control the operation of the controller 120. Namely, in order to control the general operation of the controller 120 and perform a logic calculation, the processor 124 may execute (drive) firmware loaded in the working memory 125 upon booting. Hereafter, an operation of the storage device 100 according to embodiments of the disclosure will be described as implementing a processor 124 that executes firmware in which the corresponding operation is defined.

Firmware, as a program to be executed in the storage device 100 to drive the storage device 100, may include various functional layers. For example, the firmware may include binary data in which codes for executing the functional layers, respectively, are defined.

For example, the firmware may include at least one from among a flash translation layer, which performs a translating function between a logical address requested to the storage device 100 from the host and a physical address of the memory 110; a host interface layer (HIL), which serves to analyze a command requested to the storage device 100 as a storage device from the host and transfer the command to the flash translation layer; and a flash interface layer (FIL), which transfers a command, instructed from the flash translation layer, to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation, which is defined in the firmware loaded in the working memory 125, to control the general operation of the controller 120. The processor 124 may store a result of performing the logic calculation defined in the firmware, in the working memory 125. The processor 124 may control the controller 120 according to a result of performing the logic calculation defined in the firmware such that the controller 120 generates a command or a signal. When a part of firmware, in which a logic calculation to be performed is defined, is stored in the memory 110, but not loaded in the working memory 125, the processor 124 may generate an event (e.g., an interrupt) for loading the corresponding part of the firmware into the working memory 125 from the memory 110.

The processor 124 may load metadata necessary for driving firmware from the memory 110. The metadata, as data for managing the memory 110, may include for example management information on user data stored in the memory 110.

Firmware may be updated while the storage device 100 is manufactured or while the storage device 100 is operating. The controller 120 may download new firmware from the outside of the storage device 100 and update existing firmware with the new firmware.

To drive the controller 120, the working memory 125 may store necessary firmware, a program code, a command, and data. The working memory 125 may be a volatile memory that includes, for example, at least one from among an SRAM (static RAM), a DRAM (dynamic RAM) and an SDRAM (synchronous DRAM). Meanwhile, the controller 120 may additionally use a separate volatile memory (e.g. SRAM, DRAM) located outside the controller 120 in addition to the working memory 125.

The error detection and correction circuit 126 may detect an error bit of target data, and correct the detected error bit by using an error correction code. The target data may be, for example, data stored in the working memory 125 or data read from the memory 110.

The error detection and correction circuit 126 may decode data by using an error correction code. The error detection and correction circuit 126 may be realized by various code decoders. For example, a decoder that performs unsystematic code decoding or a decoder that performs systematic code decoding may be used.

For example, the error detection and correction circuit 126 may detect an error bit by the unit of a set sector in each of the read data, when each read data is constituted by a plurality of sectors. A sector may mean a data unit that is smaller than a page, which is the read unit of a flash memory. Sectors constituting each read data may be matched with one another using an address.

The error detection and correction circuit 126 may calculate a bit error rate (BER), and may determine whether an error is correctable or not, by sector units. For example, when a bit error rate (BER) is higher than a reference value, the error detection and correction circuit 126 may determine that a corresponding sector is uncorrectable or a fail. On the other hand, when a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, then the error detection and correction circuit 126 may detect a sector which is uncorrectable in read data last. There may be one or more sectors that are determined to be uncorrectable. The error detection and correction circuit 126 may transfer information (e.g., address information) regarding a sector which is determined to be uncorrectable to the processor 124.

A bus 127 may be configured to provide communications among the components 121, 122, 124, 125 and 126 of the controller 120. The bus 127 may include, for example, a control bus for transferring various control signals, commands and the like, a data bus for transferring various data, and so forth.

Some components among the above-described components 121, 122, 124, 125 and 126 of the controller 120 may be omitted, or some components among the above-described components 121, 122, 124, 125 and 126 of the controller 120 may be integrated into one component. In addition to the above-described components 121, 122, 124, 125 and 126 of the controller 120, one or more other components may be added.

Hereinafter, the memory 110 will be described in further detail with reference to FIG. 2.

Figure 2:
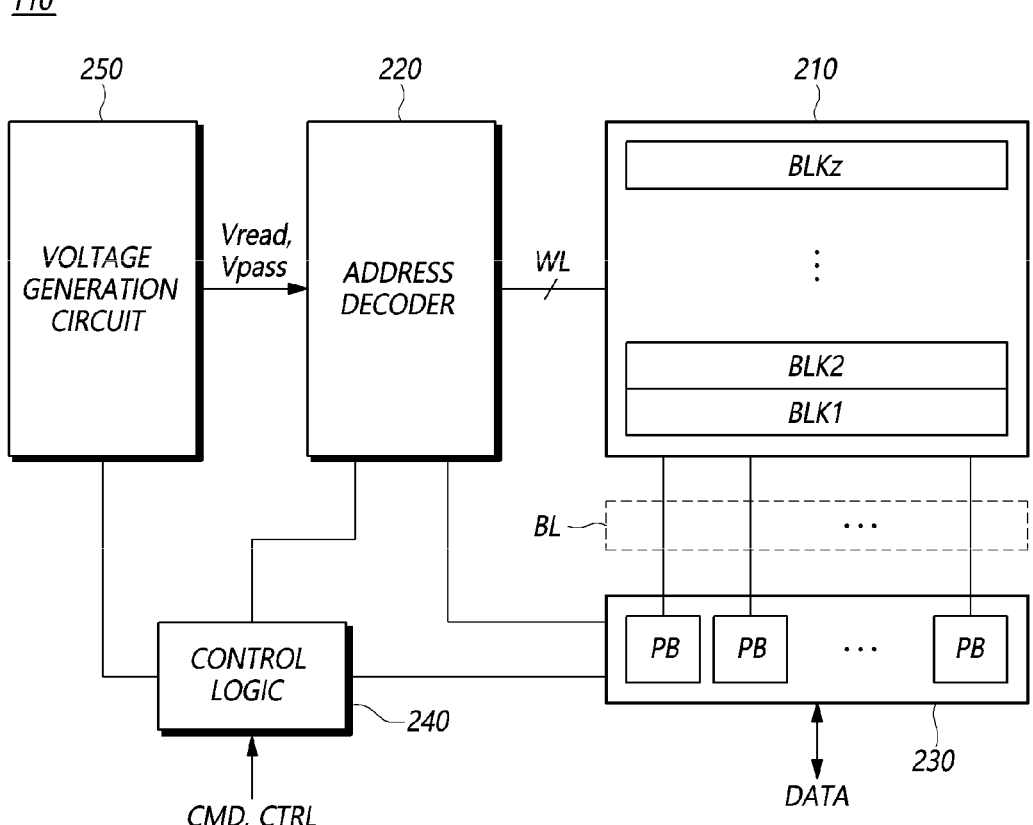
FIG. 2 is a block diagram schematically illustrating a memory of FIG. 1.

FIG. 2 is a block diagram schematically illustrating a memory of FIG. 1.

Referring to FIG. 2, a memory 110 according to an embodiment of the disclosure may include a memory cell array 210, an address decoder 220, a read and write circuit 230, a control logic 240, and a voltage generation circuit 250.

The memory cell array 210 may include a plurality of memory blocks BLK1 to BLKz (where z is a natural number greater than or equal to 2).

In the plurality of memory blocks BLK1 to BLKz, a plurality of word lines WL and a plurality of bit lines BL may be disposed, and a plurality of memory cells may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells that have vertical channel structures.

The memory cell array 210 may be configured by a memory cell array of a two-dimensional structure or may be configured by a memory cell array of a three-dimensional structure.

Each of the plurality of memory cells included in the memory cell array 210 may store at least 1-bit data. For instance, each of the plurality of memory cells included in the memory cell array 210 may be a single-level cell (SLC) that stores 1-bit data. In another instance, each of the plurality of memory cells included in the memory cell array 210 may be a multi-level cell (MLC) that stores 2-bit data. In still another instance, each of the plurality of memory cells included in the memory cell array 210 may be a triple level cell (TLC) that stores 3-bit data. In yet another instance, each of the plurality of memory cells included in the memory cell array 210 may be a quad level cell (QLC) that stores 4-bit data. In a further instance, the memory cell array 210 may include a plurality of memory cells, each of which stores 5 or more-bit data.

The number of bits of data stored in each of the plurality of memory cells may be dynamically determined. For example, a single-level cell that stores 1-bit data may be changed to a triple-level cell that stores 3-bit data.

Referring to FIG. 2, the address decoder 220, the read and write circuit 230, the control logic 240 and the voltage generation circuit 250 may operate as a peripheral circuit that drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block during a read operation, and may apply the pass voltage Vpass to the remaining unselected word lines WL.

The address decoder 220 may apply a verify voltage generated in the voltage generation circuit 250 to a selected word line WL in a selected memory block during a program verify operation, and may apply the pass voltage Vpass to the remaining unselected word lines WL. In embodiments wherein cells may store 2 or more bits of data, the voltage generation circuit 250 may be configured to generate a plurality of distinct verify voltage values for use in generating the verify voltage.

The address decoder 220 may be configured to decode a column address in the received address. The address decoder 220 may transmit the decoded column address to the read and write circuit 230.

A read operation and a program operation of the memory 110 may be performed by the unit of a page. An address received when a read operation or a program operation is requested may include at least one from among a block address, a row address, and a column address.

The address decoder 220 may select one memory block and one word line depending on a block address and a row address. A column address may be decoded by the address decoder 220 and be provided to the read and write circuit 230.

The address decoder 220 may include at least one from among a block decoder, a row decoder, a column decoder, and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit that includes a plurality of page buffers PB. The read and write circuit 230 may include data buffers that take charge of a data processing function, and may further include cache buffers that take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, changes in the amounts of current flowing, depending on the programmed states of the corresponding memory cells.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory 110. In an embodiment, the read and write circuit 230 may include a column select circuit in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. In another example, each of the plurality of word lines WL may be disposed in a column direction, and each of the plurality of bit lines BL may be disposed in a row direction.

A memory cell may be coupled to one of the plurality of word lines WL and one of the plurality of bit lines BL. A transistor may be disposed in each memory cell.

For example, a transistor disposed in each memory cell may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate, which is surrounded by a dielectric, and a control gate to which a gate voltage is applied from a word line WL.

In each memory block, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

At least one dummy word line may be additionally disposed between the first outermost word line and the first select line. At least one dummy word line may also be additionally disposed between the second outermost word line and the second select line.

A read operation and a program operation (write operation) of the memory block described above may be performed by the unit of a page, and an erase operation may be performed by the unit of a memory block.

Figure 3:
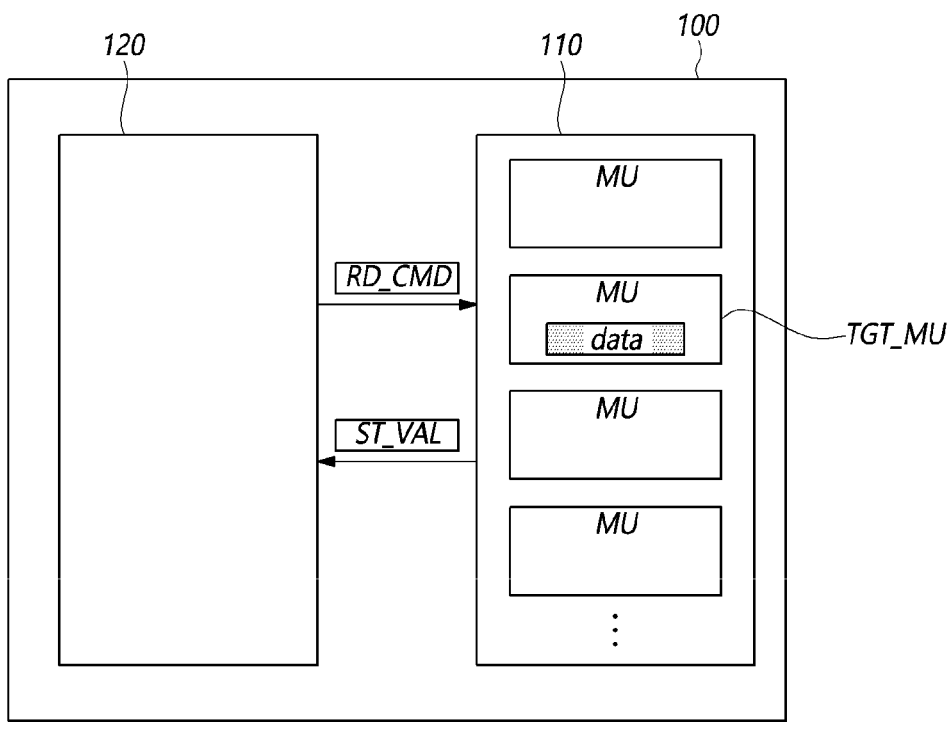
FIG. 3 illustrates a schematic structure of a storage device according to embodiments of the present disclosure.

FIG. 3 illustrates a schematic structure of a storage device according to embodiments of the present disclosure.

Referring to FIG. 3, the storage device 100 may include a memory 110 and a controller 120.

The memory 110 may include a plurality of memory units MU. Each of the plurality of memory units MU may include one or more memory blocks or one or more pages. Data may be stored in each memory unit. Each memory unit may include a plurality of memory cells.

The controller 120 may transmit a read command RD_CMD for a target memory unit TGT_MU to the memory 110. The controller 120 may transmit the read command RD_CMD for the target memory unit TGT_MU to the memory 110 in order to read data stored in the target memory unit TGT_MU among the plurality of memory units MU.

The controller 120 may read a state value ST_VAL from the memory 110 after transmitting the read command RD_CMD. For example, the controller 120 may transmit a state read command to the memory 110 to read the state value ST_VAL, and the memory 110 may transmit the state value ST_VAL to the controller 120 in response to the state read command. For example, the controller 120 can determine whether the memory 110 is ready or busy based on the state value ST_VAL. The controller 120 may repeatedly transmit a state read command to the memory 110 until the controller 120 receives a state value ST_VAL indicating that the memory 110 is in a ready state.

The controller 120 may determine, according to the state value ST_VAL, that data stored in the target memory unit TGT_MU has a specific pattern. In embodiments of the present disclosure, the controller 120 may determine that all bits of data stored in the target memory unit TGT_MU is 1 when the state value ST_VAL is a first value (e.g. E5h), and may determine that all bits of data stored in the target memory unit TGT_MU is 0 when the state value ST_VAL is a second value (e.g. E9h).

Hereinafter, a detailed operation of the controller 120 will be described in FIG. 4.

Figure 4:
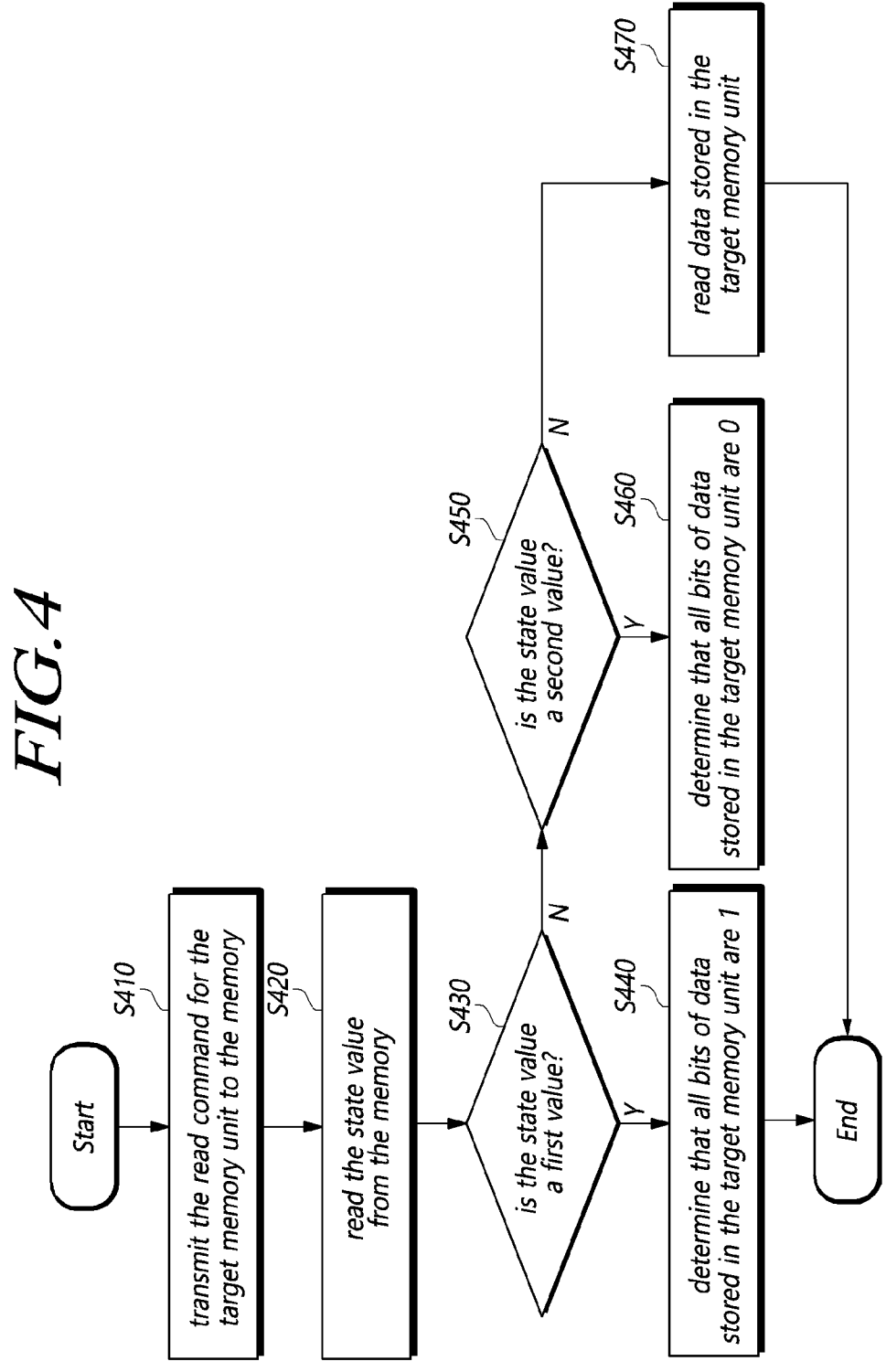
FIG. 4 illustrates an operation of a controller according to embodiments of the present disclosure.

FIG. 4 illustrates an operation of a controller according to embodiments of the present disclosure.

Referring to FIG. 4, the controller 120 may transmit the read command RD_CMD for the target memory unit TGT_MU to the memory 110 (S410).

In this case, the read command RD_CMD may include an option value indicating that the memory 110 is to set the state value ST_VAL to the first value or the second value when the data stored in the target memory unit TGT_MU of the read command RD_CMD meet respective corresponding conditions for the first and second values as described herein.

After transmitting the read command RD_CMD to the memory 110, the controller 120 may read the state value ST_VAL from the memory 110 (S420). As described above, the controller 120 may transmit a state read command to the memory 110 to the memory 110 to read the state value ST_VAL, and the memory 110 may transmit the state value ST_VAL to the controller 120 in response to the state read command.

The controller 120 may determine whether the state value ST_VAL read from the memory 110 is a first value (S430). When the state value ST_VAL is the first value (S430-Y), the controller 120 may determine that all bits of data stored in the target memory unit TGT_MU are 1 (S440). At this time, the controller 120 can determine that all bits of data stored in the target memory unit TGT_MU are 1 even without reading the data stored in the target memory unit TGT_MU.

On the other hand, when the state value ST_VAL is not the first value (S430-N), the controller 120 may determine whether the state value ST_VAL is a second value (S450). When the state value ST_VAL is the second value (S450-Y), the controller 120 may determine that all bits of data stored in the target memory unit TGT_MU are 0 (S460). At this time, the controller 120 can determine that all bits of data stored in the target memory unit TGT_MU are 0 even without reading the data stored in the target memory unit TGT_MU.

On the other hand, when the state value ST_VAL is not the second value (S450-N), the controller 120 may read data stored in the target memory unit TGT_MU in order to know the data stored in the target memory unit TGT_MU (S470). In embodiments, the controller 120 may read the data stored in the target memory unit TGT_MU when the state value ST_VAL is not the first or second value but indicates that the memory 110 is in a ready state.

While FIG. 4 shows the controller 120 first determining whether the state value ST_VAL read from the memory 110 is the first value, embodiments are not limited thereto. In another embodiment, the controller 120 may first determine whether the state value ST_VAL read from the memory 110 is the second value. Furthermore, the controller 120 may determine that the state value ST_VAL is a value indicating that the memory 110 is ready before determining whether the state value ST_VAL is the first value or the second value.

As described above, the controller 120 may determine whether all bits of data stored in the target memory unit TGT_MU are 1 or all bits of data stored in the target memory unit TGT_MU are 0 based on the state value ST_VAL read from the memory 110.

Hereinafter, a specific example in which the memory 110 sets the state value ST_VAL will be described.

Figure 5:
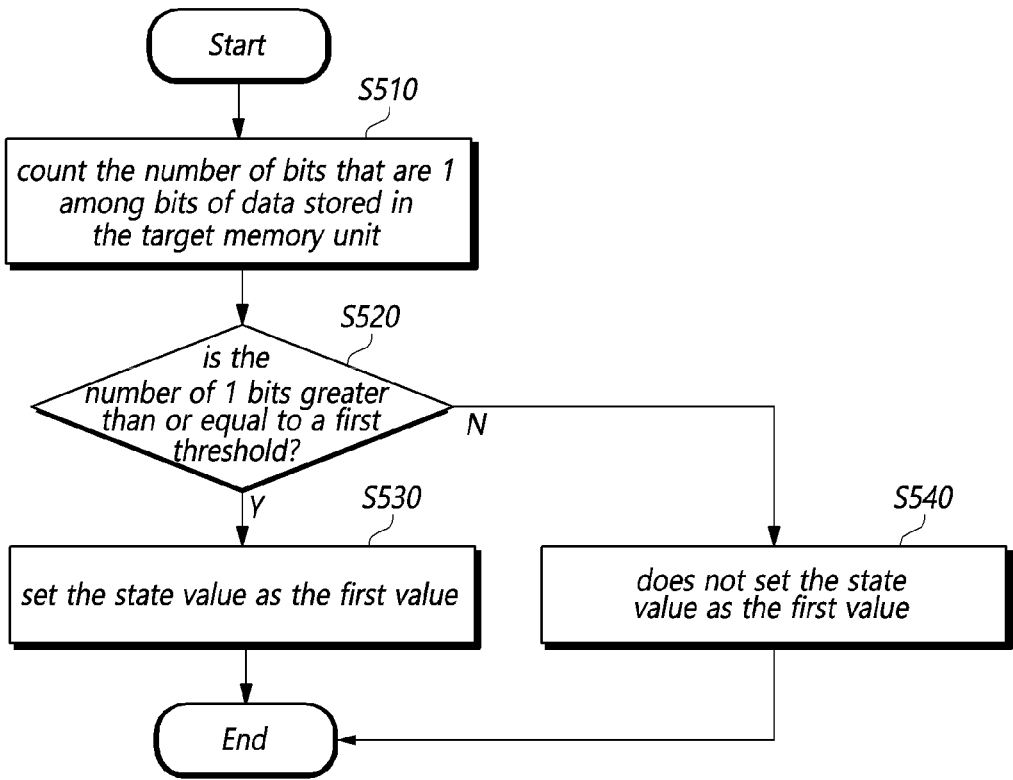
FIG. 5 is a flowchart illustrating an example in which a memory set a state value according to embodiments of the present disclosure.

FIG. 5 is a flowchart illustrating an example in which a memory sets a state value according to embodiments of the present disclosure.

Referring to FIG. 5, the memory 110 may determine the number of bits that are 1 among bits of data stored in the target memory unit TGT_MU (S510). For example, the memory 110 may read data stored in the target memory unit TGT_MU, load the data stored in the target memory unit TGT_MU into the aforementioned page buffer PB, and then count the number of bits that are 1 among bits of data loaded into the page buffer PB. The memory 110 may use a count circuit to count the number of bits of data that are 1.

When reading data stored in the target memory unit TGT_MU, the memory 110 may apply a read voltage to a plurality of memory cells included in the target memory unit TGT_MU, and may sense data stored in the plurality of memory cells in a state where the read voltage is applied. Since the threshold voltages of the plurality of memory cells are determined according to stored data, the operation of reading the data stored in the target memory unit TGT_MU may be an operation of identifying the state of the threshold voltage of the plurality of memory cells. For example, when the plurality of memory cells are programmed with TLC, 7 read voltages may be applied to identify a threshold voltage corresponding to one of an erase state and first to seventh program states.

For example, among a plurality of memory cells to which a read voltage is applied, a memory cell having a threshold voltage lower than the read voltage may be read as on-cell. In a single-level cell, an on-cell may correspond to a stored logical value of 1. Among the plurality of memory cells to which the read voltage is applied, a memory cell having a threshold voltage higher than the read voltage may be read as off-cell. In a single-level cell an off-cell may correspond to a stored logical value of 0. In a cell having more than one level (such as an MLC, TLC or QLC cell), the multi-bit stored logical value corresponds to a value of the read voltage at which the cell changes from an on-cell to an off-cell or changes from an off-cell to an on-cell as the read voltage is sequenced through a plurality of read voltage values.

Then, the memory 110 may determine whether the number of 1 bits among bits of data stored in the target memory unit TGT_MU is greater than or equal to a first threshold (S520). In embodiments, the first threshold may be less than the total number of bits of data stored in the target memory unit. In an embodiment, the memory 110 may stop counting the number of 1 bits once it is determined that the number of 1 bits is greater than the first threshold.

In another embodiment, the memory 110 may determine whether the number of 1 bits among bits of data stored in the target memory unit TGT_MU is greater than or equal to the first threshold by determining whether the number of 0 bits among the bits of data is less than a difference between the total number of bits stored in the target memory unit TGT_MU and the first threshold. In an embodiment, the memory 110 may stop determining the number of 0 bits once it is determined that the number of 0 bits is greater than or equal to the difference between the total number of bits stored in the target memory unit TGT_MU and the first threshold, since this indicates that it is impossible for the number of 1 bits to be greater than the first threshold.

When the number of 1 bits is greater than or equal to the first threshold (S520-Y), the memory 110 may set the state value ST_VAL as the first value (S530). Although all bits of data stored in the target memory unit TGT_MU are programmed to 1, some bits may be read as 0 when reading data stored in the target memory unit TGT_MU due to defects in some of the memory cells included in the target memory unit TGT_MU. In this case, it can be determined that all bits of data stored in the target memory unit TGT_MU are 1 through decoding an error correction code. Accordingly, when the number of 1 bits is greater than or equal to the first threshold, the memory 110 may set the state value ST_VAL as the first value. In embodiments, the difference between the first threshold and the total number of bits stored in the target memory unit TGT_MU may correspond to, for example, half of a Hamming distance of the error correcting code used to store data in the memory 110.

On the other hand, when the number of 1 bits is less than the first threshold (S520-N), the memory 110 may not set the state value ST_VAL as the first value (S540).

Figure 6:
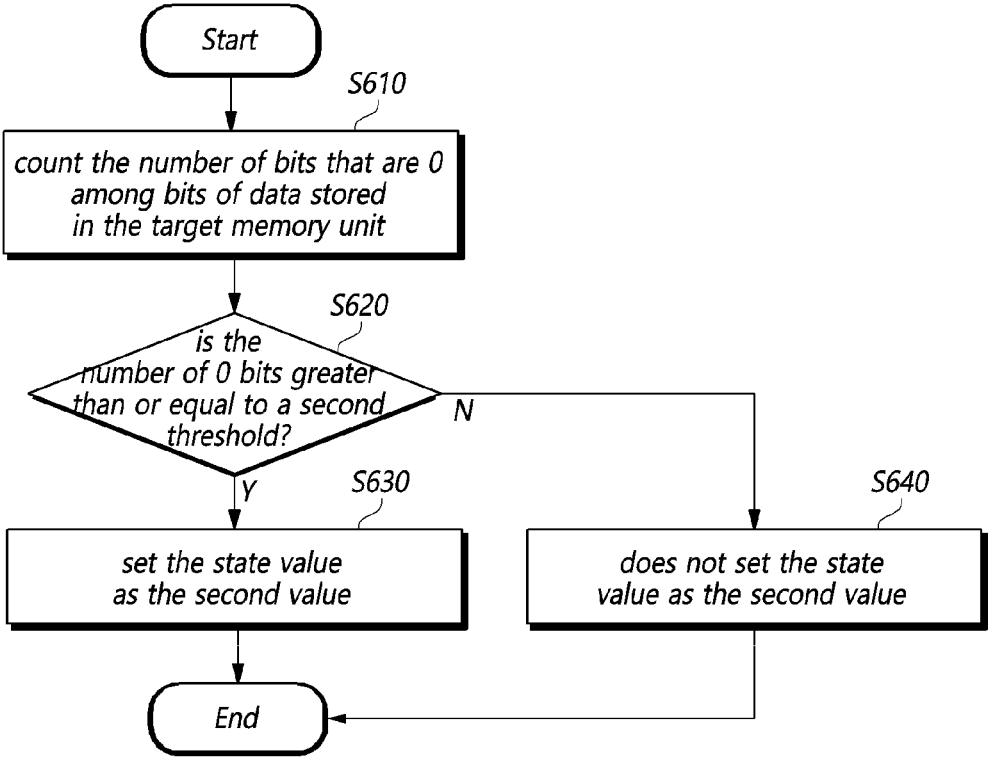
FIG. 6 is a flowchart illustrating another example in which a memory set a state value according to embodiments of the present disclosure.

FIG. 6 illustrates a flowchart illustrating another example in which a memory sets a state value according to embodiments of the present disclosure. The operations described with reference to FIG. 6 may be performed in parallel with the operations described with reference to FIG. 5.

Referring to FIG. 6, the memory 110 may determine the number of bits that are 0 among bits of data stored in the target memory unit TGT_MU (S610). For example, the memory 110 may load the data stored in the target memory unit TGT_MU into the aforementioned page buffer PB and then count the number of bits that are 0 among bits of data loaded into the page buffer PB.

As another example, the memory 110 may include a current sensing circuit (CSC). The memory 110 may load data stored in the target memory unit TGT_MU into the page buffer PB, and compare the current sensed for the page buffer PB with a reference current value to determine the number of bits that are 0 among data bits stored in the target memory unit TGT_MU. Since the size of the current sensed by the current sensing circuit varies depending on the number of bits of 1 and the number of bits of 0 in the data, the memory 100 may determine the number of 0 bits among bits of the data stored in the target memory unit TGT_MU based on the magnitude of the current sensed by the current sensing circuit.

Then, the memory 110 may determine whether the number of 0 bits among bits of data stored in the target memory unit TGT_MU is greater than or equal to a second threshold (S620). In this case, the second threshold may be less than the total number of bits of data stored in the target memory unit TGT_MU. In some embodiments, the second threshold may be the same as the aforementioned first threshold; in other embodiments the second threshold may be different from the aforementioned first threshold.

When the number of 0 bits is equal to or greater than the second threshold (S620-Y), the memory 110 may set the state value ST_VAL as a second value (S630). Although all bits of data stored in the target memory unit TGT_MU are programmed to 0, some bits may be read as 1 when reading data stored in the target memory unit TGT_MU due to defects in some of the memory cells included in the target memory unit TGT_MU. In this case, it can be determined that all bits of data stored in the target memory unit TGT_MU are 0 through decoding such as error correction decoding. Accordingly, when the number of 0 bits is greater than or equal to the second threshold, the memory 110 may set the state value ST_VAL as the second value.

On the other hand, when the number of 0 bit is less than the second threshold (S620-N), the memory 110 may not set the state value ST_VAL to the second value (S640).

In the above, a specific example in which the memory 110 sets the state value ST_VAL has been described.

Hereinafter, mutual operations of the controller 120 and the memory 110 according to embodiments of the present disclosure will be described through a series of sequence diagrams.

Figure 7:
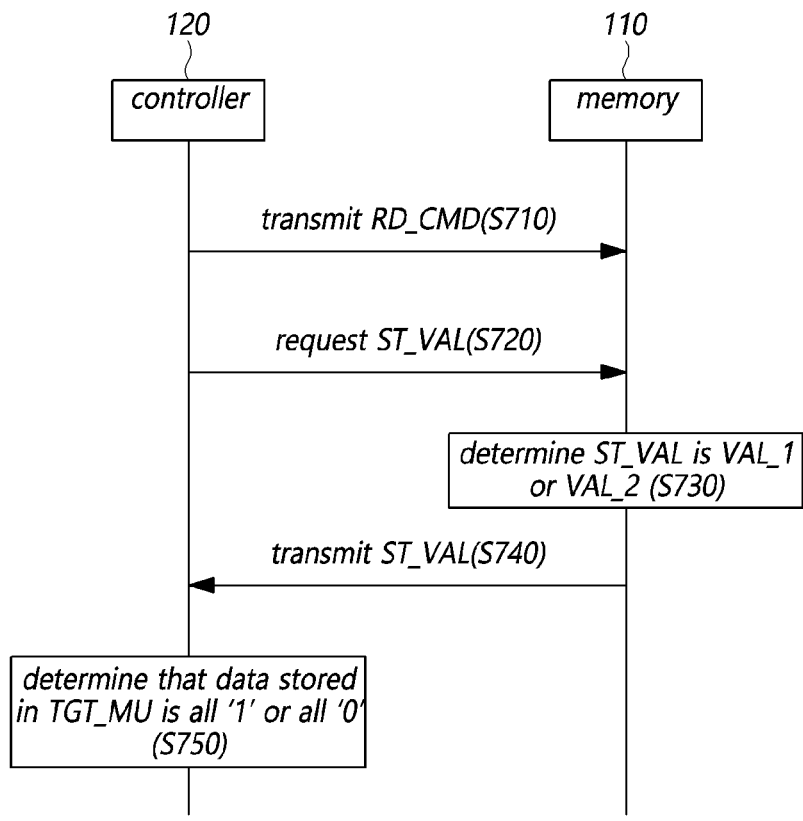
FIG. 7 is a sequence diagram illustrating an example of operation a controller and a memory according to embodiments of the present disclosure.
Figure 8:
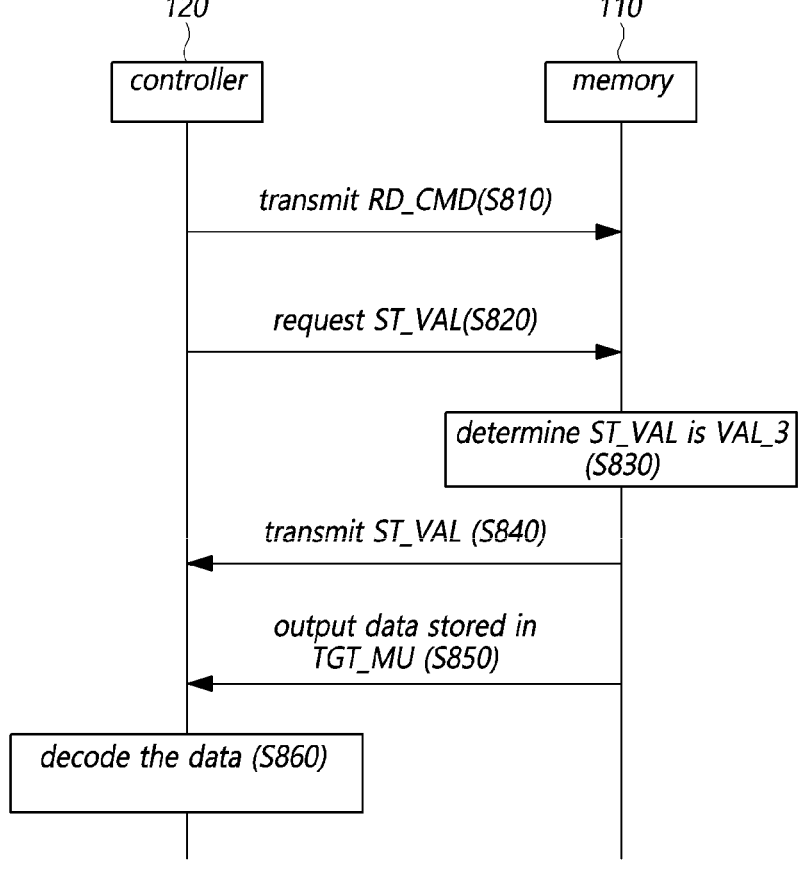
FIG. 8 is a sequence diagram illustrating another example of operation a controller and a memory according to embodiments of the present disclosure.

FIG. 7 is a sequence diagram illustrating an example of operation of a controller and a memory according to embodiments of the present disclosure. The sequence diagram of FIG. 7 illustrates a case wherein data to be read is either all ones or all zeros; the case where the data to be read is not all ones or all zeros is illustrated in FIG. 8.

Referring to FIG. 7, the controller 120 may transmit the read command RD_CMD for a target memory unit TGT_MU to the memory 110 (S710).

The controller 120 may then transmit a request for the state value ST_VAL to the memory 110 to read the state value ST_VAL (S720).

After receiving the request from the controller 120, the memory 110 may determine the state value ST_VAL as the first value VAL_1 or the second value VAL_2 (S730). In the embodiments of the present disclosure, the memory 110 may set the state value ST_VAL to the first value VAL_1 when it is determined that all bits of data stored in the target memory unit TGT_MU are 1, and set the state value ST_VAL to the second value VAL_2 when it is determined that all bits of data stored in the target memory unit TGT_MU are 0.

After that, the memory 110 may transmit the state value ST_VAL to the controller 120 (S740). In the illustrated case, the state value ST_VAL is the first value VAL_1 or the second value VAL_2.

The controller 120 may determine whether all bit of data stored in the target memory unit TGT_MU are 1 or all bit of data stored in the target memory unit TGT_MU are 0 based on the state value ST_VAL received from the memory 110 (S750). For example, the controller 120 may determine that all bits of data stored in the target memory unit TGT_MU are 1 when the state value ST_VAL is the first value VAL_1, and determine that all bits of data stored in the target memory unit TGT_MU are 0 when the state value ST_VAL is the second value VAL_2.

At this time, the memory 110 may not output data stored in the target memory unit TGT_MU to the controller 120. This is because even if the controller 120 does not read the data stored in the target memory unit TGT_MU from the memory 110, the controller 120 can know that all bits of the data stored in the target memory unit TGT_MU are 1 or all bits of the data stored in the target memory unit TGT_MU are 0.

However, unlike the case shown in FIG. 7, the controller 120 may transmit a command requesting output of data stored in the target memory unit TGT_MU to the memory 110. In this case, the memory 110 may output data stored in the target memory unit TGT_MU even if the state value ST_VAL is the first value VAL_1 of the second value VAL_2.

Also, the controller 120 may not decode data stored in the target memory unit TGT_MU. This is because it can be known that all bits of data stored in the target memory unit TGT_MU are 1 or all bits of data stored in the target memory unit TGT_MU are 0 even if the controller 120 does not decode the data output from the memory 110.

FIG. 8 illustrates a sequence diagram illustrating another example of operation of a controller and a memory according to embodiments of the present disclosure. The sequence diagram of FIG. 7 illustrates a case wherein data to be read is neither all ones nor all zeros;

Referring to FIG. 8, the controller 120 may transmit the read command RD_CMD for the target memory unit TGT_MU to the memory 110 (S810).

The controller 120 may then send a request for the state value ST_VAL to the memory 110 to read the state value ST_VAL (S820).

After receiving the request from the controller 120, the memory 110 may determine the state value ST_VAL as a third value VAL_3 (S830). For example, the memory 110 may set the state value ST_VAL to the third value VAL_3 when it is determined that neither all bits of data stored in the target memory unit TGT_MU are 1 nor all bits of data stored in the target memory unit TGT_MU are 0.

After that, the memory 110 may transmit the state value ST_VAL to the controller 120 (S840). In this case, the state value ST_VAL is the third value VAL_3.

After that, the memory 110 may output data stored in the target memory unit TGT_MU to the controller 120 (S850). This is because the controller 120 cannot know the data stored in the target memory unit TGT_MU using only the state value ST_VAL. Therefore, in order to know the data stored in the target memory unit TGT_MU, the controller 120 needs to read data output from the memory 110.

The controller 120 may decode data read from the memory 110 (S860). This is because the controller 120 needs to execute error correction on data read from the memory 110.

Figure 9:
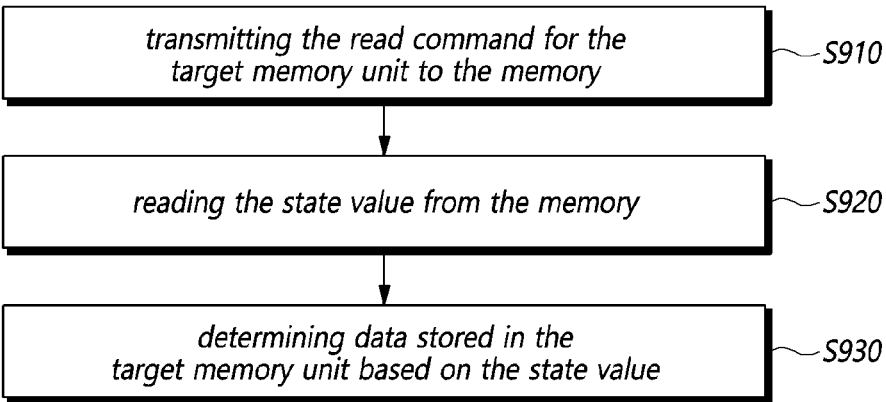
FIG. 9 illustrates an operating method of a storage device according to embodiments of the present disclosure.

FIG. 9 illustrates an operating method of a storage device according to embodiments of the present disclosure. Referring to FIG. 9, the operating method of the storage device 100 may include transmitting the read command RD_CMD for the target memory unit TGT_MU among the plurality of memory units MU included in the memory 110 (S910).

The operating method of the storage device 100 may include reading the state value ST_VAL from the memory 110 after transmitting the read command RD_CMD to the memory 110 (S920).

And the operating method of the storage device 100 may include determining data stored in the target memory unit TGT_MU based on the state value ST_VAL (S930). In this case, the operation S930 may include i) determining that all bits of data stored in the target memory unit TGT_MU are 1 when the state value ST_VAL is the first value, and ii) determining that all bits of data stored in the target memory unit are 0 when the state value ST_VAL is the second value.

For example, the state value ST_VAL may be set to the first value when the number of bits of 1 among bits of data stored in the target memory unit TGT_MU is equal to or greater than the first threshold. The first threshold may be less than the total number of bits of data stored in the target memory unit TGT_MU.

For example, the state value ST_VAL may be set to the second value when the number of bits of 0 among bits of data stored in the target memory unit TGT_MU is equal to or greater than the second threshold. The second threshold may be less than the total number of bits of data stored in the target memory unit TGT_MU.

Meanwhile, the operation S930 may not read data stored in the target memory unit TGT_MU when the state value ST_VAL is set to the first value or the second value, and may read data stored in the target memory unit TGT_MU when the state value ST_VAL is set to a third value.

And the operation S930 may not decode data stored in the target memory unit TGT_MU when the state value ST_VAL is set to the first value or the second value, and may decode data stored in the target memory unit TGT_MU when the state value ST_VAL is set to the third value.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A storage device comprising:
a memory including a plurality of memory units; and
a controller configured to:
   transmit, in response to a command from a requestor, a set state command to the memory for accessing a target memory unit among the plurality of memory units of the memory, the set state command including an option value indicating that the memory is to set a state value according to data stored in the target memory unit,
   read the state value from the memory by transmitting a state read command after the set state command, and
   determine, based on the state value, values of the data stored in the target memory unit by:
   in response to the state value being a first value, determining that all bits of the data stored in the target memory unit are 1 and not to send a data output command to the memory,
   in response to the state value being a second value, determining that all bits of the data stored in the target memory unit are 0 and not to send the data output command to the memory,
   in response to the state value being neither the first value nor the second value, sending the data output command requesting output of the data stored in the target memory unit to the memory and receiving the data stored in the target memory unit from the memory, and
   transmit the determined value of the data stored in the target memory unit to the requestor,
wherein the memory is configured to set the state value to the first value when a number of bits having a value of 1 among bits of the data stored in the target memory unit is equal to or greater than a first threshold, and
wherein the first threshold is less than a total number of bits of data stored in the target memory unit.

2. The storage device according to claim 1,
wherein the memory is configured to set the state value to the second value when a number of bits having a value of 0 among bits of the data stored in the target memory unit is equal to or greater than a second threshold, and
wherein the second threshold is less than a total number of bits of data stored in the target memory unit.

3. The storage device according to claim 1,
wherein the memory is configured to output the data stored in the target memory unit to the controller when the state value is set to a third value.

4. The storage device according to claim 3,
wherein the controller is configured not to decode the data stored in the target memory unit when the state value is set to the first value or the second value, and
wherein the controller is configured to decode the data stored in the target memory unit when the state value is set to the third value.

5. The storage device according to claim 1,
wherein the controller is configured to determine whether to skip the data output command based on the state value.

6. A method for operating a storage device, comprising:
transmitting, in response to receiving a command from a requestor, a set state command to a memory for accessing a target memory unit among a plurality of memory units included in the memory, the set state command including an option value indicating that the memory is to set a state value according to data stored in the target memory unit;

reading the state value from the memory by transmitting a state read command after the set state command; and determining values of the data stored in the target memory unit by:

determining that all bits of data stored in the target memory unit are 1 in response to the state value being a first value, determining that all bits of the data stored in the target memory unit are 0 in response to the state value being a second value, in response to the state value being neither the first value nor the second value, sending a data output command requesting output of the data stored in the target memory unit to the memory and receiving the data stored in the target memory unit from the memory, and transmitting the determined values of the data stored in the target memory unit to the requestor, wherein the method further comprises:

setting, by the memory, the state value to the first value when a number of bits of 1 among the bits of the data stored in the target memory unit is equal to or greater than a first threshold, wherein the first threshold is less than the total number of bits of the data stored in the target memory unit.

7. The method according to claim 6, further comprising:

setting, by the memory, the state value to the second value when a number of bits of 0 among the bits of the data stored in the target memory unit is equal to or greater than a second threshold, wherein the second threshold is less than the total number of bits of data stored in the target memory unit.

8. The method according to claim 6, wherein determining the values of the data stored in the target memory unit comprises:

not outputting the data stored in the target memory unit from the memory when the state value is set to the first value or the second value, and outputting the data stored in the target memory unit from the memory when the state value is set to a third value.

9. The method according to claim 6, wherein determining the values of the data stored in the target memory unit comprises:

not decoding the data stored in the target memory unit when the state value is set to the first value or the second value, and decoding the data stored in the target memory unit when the state value is set to a third value.

10. The method according to claim 6, wherein the determining whether to send the data output command include determining whether to skip the data output command based on the state value.

11. A controller circuit comprising:

an interface configured to communicate with a memory device, the memory device including a plurality of memory units, wherein the controller circuit is configured to:

transmit, in response to receiving a command from a requestor, a set state command to the memory device for accessing a target memory unit among the plurality of memory units, the set state command includes an option value indicating that the memory device is to set a state value according to data stored in the target memory unit, read the state value from the memory device by transmitting a state read command after the set state command, and determine, based on the state value, values of the data stored in the target memory unit by:

in response to the state value being a first value, determining that all bits of the data stored in the target memory unit are 1 and not to send a data output command to the memory device, in response to the state value being a second value, determining that all bits of the data stored in the target memory unit are 0 and not to send the data output command to the memory device, in response to the state value being neither the first value nor the second value, sending the data output command requesting output of the data stored in the target memory unit to the memory and receiving the data stored in the target memory unit from the memory device, and transmit the determined values of the data stored in the target memory unit to the requestor, wherein the state value is set to the first value when a number of bits having a value of 1 among bits of the data stored in the target memory unit is equal to or greater than a first threshold, and wherein the first threshold is less than a total number of bits of the data stored in the target memory unit.

* * * * *